United States Patent
Shim et al.

(10) Patent No.: US 7,898,271 B2
(45) Date of Patent: Mar. 1, 2011

(54) POSITION CHANGING APPARATUS FOR TEST HANDLER AND POWER TRANSFERRING APPARATUS

(75) Inventors: Jae-Gyun Shim, Suwon (KR); Yun-Sung Na, Cheunan (KR); In-Gu Jeon, Suwon (KR); Tae-Hung Ku, Suwon (KR); Dong-Han Kim, Suwon (KR)

(73) Assignee: TechWing., Co., Ltd., Yongin (KR)

( * ) Notice: Subject to any disclaimer, the term of this patent is extended or adjusted under 35 U.S.C. 154(b) by 0 days.

(21) Appl. No.: 12/385,790

(22) Filed: Apr. 20, 2009

(65) Prior Publication Data

US 2010/0001753 A1 Jan. 7, 2010

Related U.S. Application Data

(63) Continuation of application No. 11/639,418, filed on Dec. 15, 2006, now Pat. No. 7,538,542.

(30) Foreign Application Priority Data

Dec. 15, 2005 (KR) ........................ 10-2005-0124223

(51) Int. Cl.
*G01R 31/00* (2006.01)
(52) U.S. Cl. .............................. 324/750.01; 324/750.02

(58) Field of Classification Search ........................ None
See application file for complete search history.

(56) References Cited

U.S. PATENT DOCUMENTS

| 4,926,118 | A |   | 5/1990 | O'Connor et al. |           |
|-----------|---|---|--------|-----------------|-----------|
| 5,617,945 | A |   | 4/1997 | Takahashi et al.|           |
| 6,137,286 | A | * | 10/2000| Ho et al.       | 324/158.1 |
| 6,163,145 | A | * | 12/2000| Yamada et al.   | 324/158.1 |
| 7,408,338 | B2| * | 8/2008 | Ham et al.      | 324/158.1 |
| 7,538,542 | B2| * | 5/2009 | Shim et al.     | 324/158.1 |

FOREIGN PATENT DOCUMENTS

| JP | 03-057240      | 3/1991  |
| JP | 09-152466      | 10/1997 |
| JP | 11-287843      | 10/1999 |
| KR | 100194326 B1   | 2/1999  |
| KR | 100223093 B1   | 7/1999  |
| KR | 102002-0044278 A | 6/2002 |

* cited by examiner

*Primary Examiner* — Vinh P Nguyen

(74) *Attorney, Agent, or Firm* — Roylance, Abrams, Berdo & Goodman, LLP

(57) ABSTRACT

A test handler is disclosed. A posture changing unit for changing a posture of a test tray on which semiconductor devices have been loaded changes the posture of the test tray in a soak chamber. While the posture of the test tray is changed, the devices can be pre-heated/pre-cooled, thereby reducing the soak chamber length and the pre-heating/pre-cooling time.

10 Claims, 12 Drawing Sheets

POSITION CHANGING APPARATUS FOR TEST HANDLER AND POWER TRANSFERRING APPARATUS

CROSS-REFERENCE TO RELATED APPLICATIONS

This application is a continuation of prior U.S. patent application Ser. No. 11/639,418, filed Dec. 15, 2006, now U.S. Pat. No. 7,538,542, and claims benefit under 35 U.S.C. §119(a) of Korean Patent Application No. 10-2005-0124223, filed Dec. 15, 2005, in the Korean Intellectual Property Office, the entire disclosures of which are hereby incorporated by reference.

BACKGROUND OF THE INVENTION

1. Field of the Invention

The present invention relates to a test handler for supporting a test of semiconductor devices. More particularly, the present invention relates to an arrangement structure and an operation method of a posture changing unit of the test handler for changing the posture of a test tray.

2. Description of the Related Art

In general, a test handler supports a test of semiconductor devices hereinafter, referred to as a 'device') manufactured through a predetermined manufacturing process, and sorts and loads the devices on user trays according to the test results. To sort the devices according to the test results, the test handler circulates a test tray against a tester head. The test handler is classified into an under head docking type and a side docking type according to a docking method between the test handler and a tester.

The side docking type test handler transfers devices from user trays to a horizontal posture test tray, changes the horizontal posture of the device-loaded test tray into the vertical posture, pre-heats/pre-cools the vertical posture test tray, and connects the vertical posture test tray to a vertical posture tester head. After the test, the test handler restores the vertical posture test tray to the normal temperature, changes the vertical posture of the test tray to the horizontal posture, and sorts and unloads the devices to the user tray according to the test results.

As publicly known, the side docking type test handler includes a loading unit, a vertical posture changing unit, a soak chamber, a test chamber, a de-soak chamber, a horizontal posture changing unit and an unloading unit. The structure of the test handler will now be briefly explained with reference to FIG. 12.

The loading unit 1120 transfers and loads devices loaded on user trays 1110 to a horizontal posture test tray.

The vertical posture changing unit 1130 is positioned in the upward direction of the soak chamber 1200, and changes the horizontal posture of the test tray into the vertical posture before supplying the test tray to the soak chamber 1200.

The soak chamber 1200 sequentially receives the test trays posture-changed into the vertical posture by the vertical posture changing unit 1130, and has a temperature environment for pre-heating/pre-cooling the devices loaded on each test tray. The test trays entering the soak chamber 1200 are translated closely to the test chamber 1100 with the vertical posture. During the translation, the devices loaded on the test trays are sufficiently pre-heated/pre-cooled.

The test chamber 1100 is installed to the test handler, in which the devices loaded on the test tray supplied from the soak chamber 1200 can be tested by a tester. For this, the test chamber 1100 has a temperature environment for testing the devices.

The de-soak chamber 1300 (restoring chamber) restores the heated or cooled devices to the normal temperature.

The horizontal posture changing unit 1230 is positioned in the upward direction of the de-soak chamber 1300 for changing the vertical posture of the test tray transferred from the de-soak chamber 1300 to the horizontal posture.

The unloading unit 1360 sorts and unloads (transfers and loads) the test-completed devices to user trays 1310 according to the test results.

With the recent increase in demand and production of devices, the test handler has been developed to increase the number of devices tested at a time by loading many devices on one test tray, namely, to enlarge the test tray to carry many devices. If the test tray is two-dimensionally enlarged to test many devices at a time, the space for changing the posture of the test tray is three-dimensionally enlarged.

In the side docking type test handler, the posture changing unit is installed in the upward direction of the soak chamber, and the test tray posture-changed by the posture changing unit is transferred in the downward direction and received in the soak chamber. When the side docking type test handler adopts the enlarged test tray, the whole size of the test handler must be increased more than the enlarged size of the test tray by a few times in order to prevent interferences between the space for changing the posture of the test tray and the wall of the soak chamber. However, the test handler can be put into practical use only under a predetermined external appearance standard (such as width, length and height). As a result, in relation to the enlargement tendency of the test tray, the test handler has already reached the maximum size.

Furthermore, since the pre-heating/pre-cooling process is started after the vertical posture change of the test tray, the soak chamber must have a relatively long translation section. It is thus difficult to reduce the length of the test handler and the pre-heating/pre-cooling time.

SUMMARY OF THE INVENTION

Therefore, the present invention has been made in view of the above problems and/or disadvantages, and it is an object of the present invention to provide a technique of increasing the size of a test tray without seriously increasing the overall size of a test handler.

It is another object of the present invention to provide a technique of obtaining a posture changing time and a pre-heating/pre-cooling time of a test tray, while reducing the overall processing time of a test handler.

In accordance with the present invention, the above and other objects can be accomplished by the provision of a test handler, including: a loading unit for loading devices loaded on user trays onto a test tray; a posture changing unit for changing a posture of the test tray on which the devices have been loaded by the loading unit; a soak chamber for sequentially receiving the test trays posture-changed by the posture changing unit; a test chamber in which the devices loaded on the test tray supplied from the soak chamber are tested by a tester; a temperature controller for pre-heating/pre-cooling the devices loaded on the test tray before supplying the test tray to the test chamber; and an unloading unit for unloading the devices test-completed in the test chamber onto the user trays. Here, the temperature controller continuously pre-heats/pre-cools the devices on the test tray while the test tray is posture-changed by the posture changing unit and received in the soak chamber. Also, the posture changing unit includes a rotator posture-changeably installed in the soak chamber for holding the test tray entering the soak chamber and a first power source for providing power for changing the posture of the rotator.

In exemplary implementation of the present invention, the first power source is installed outside the soak chamber and separated from pre-heating/pre-cooling of the temperature controller.

In exemplary implementation of the present invention, the test handler further includes a stopper unit for preventing separation of the test tray during the posture change of the rotator.

In exemplary implementation of the present invention, the stopper unit includes: a stopper for hooking or unhooking the rear end of the test tray which has entered the rotator; a second power source for providing power for the operation of the stopper; and a power transmitting shaft for transmitting power from the second power source to the stopper.

In exemplary implementation of the present invention, the second power source is installed outside the soak chamber and separated from pre-heating/pre-cooling of the temperature controller.

In accordance with an aspect of the present invention, the above and other objects can be accomplished by the provision of an operation method of a test handler, including: a loading step of loading devices of user trays onto a test tray; a posture changing step of changing a posture of the test tray with pre-heating/pre-cooling the devices on the test tray after completing the loading step; a translation step of translating the test tray posture-changed in the posture changing step with continuously pre-heating/pre-cooling the devices on the test tray; a test step of testing the devices pre-heated/pre-cooled in the posture changing step and the translation step; and an unloading step for unloading the devices test-completed in the test step from the test tray to the user trays.

In exemplary implementation of the present invention, the loading step loads the devices of the user trays onto the horizontal posture test tray, and the posture changing step changes the horizontal posture of the test tray into the vertical posture.

In exemplary implementation of the present invention, the translation step sequentially receives and translates the posture-changed test trays with pre-heating/pre-cooling the devices on each test tray.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features and other advantages of the present invention will be more clearly understood from the following detailed description taken in conjunction with the accompanying drawings, in which.

Throughout the drawings, the same drawing reference numerals will be understood to refer to the same elements, features, and structures.

DESCRIPTION OF EXEMPLARY EMBODIMENTS

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

In accordance with an exemplary embodiment of the present invention, a test handler includes a loading unit, a soak posture changing unit (vertical posture changing unit), a soak chamber, a test chamber, a de-soak chamber, a de-soak posture changing unit (horizontal posture changing unit), and an unloading unit. The technical contents of the loading unit, the test chamber, the de-soak chamber and the unloading unit which are not closely associated with an exemplary embodiment of the present invention have been publicly known and briefly mentioned in the background art. Therefore, detailed explanations thereof are omitted for clarity and conciseness.

According to the technical characteristic of an exemplary embodiment of the present invention, the vertical posture changing unit is installed in the soak chamber, in more detail, a rotator of the posture changing unit is installed in the soak chamber, so that a test tray can be pre-heated/pre-cooled during the vertical posture change. This structural characteristic will now be explained in detail with reference to FIGS. 1 to 8.

Figure 1:
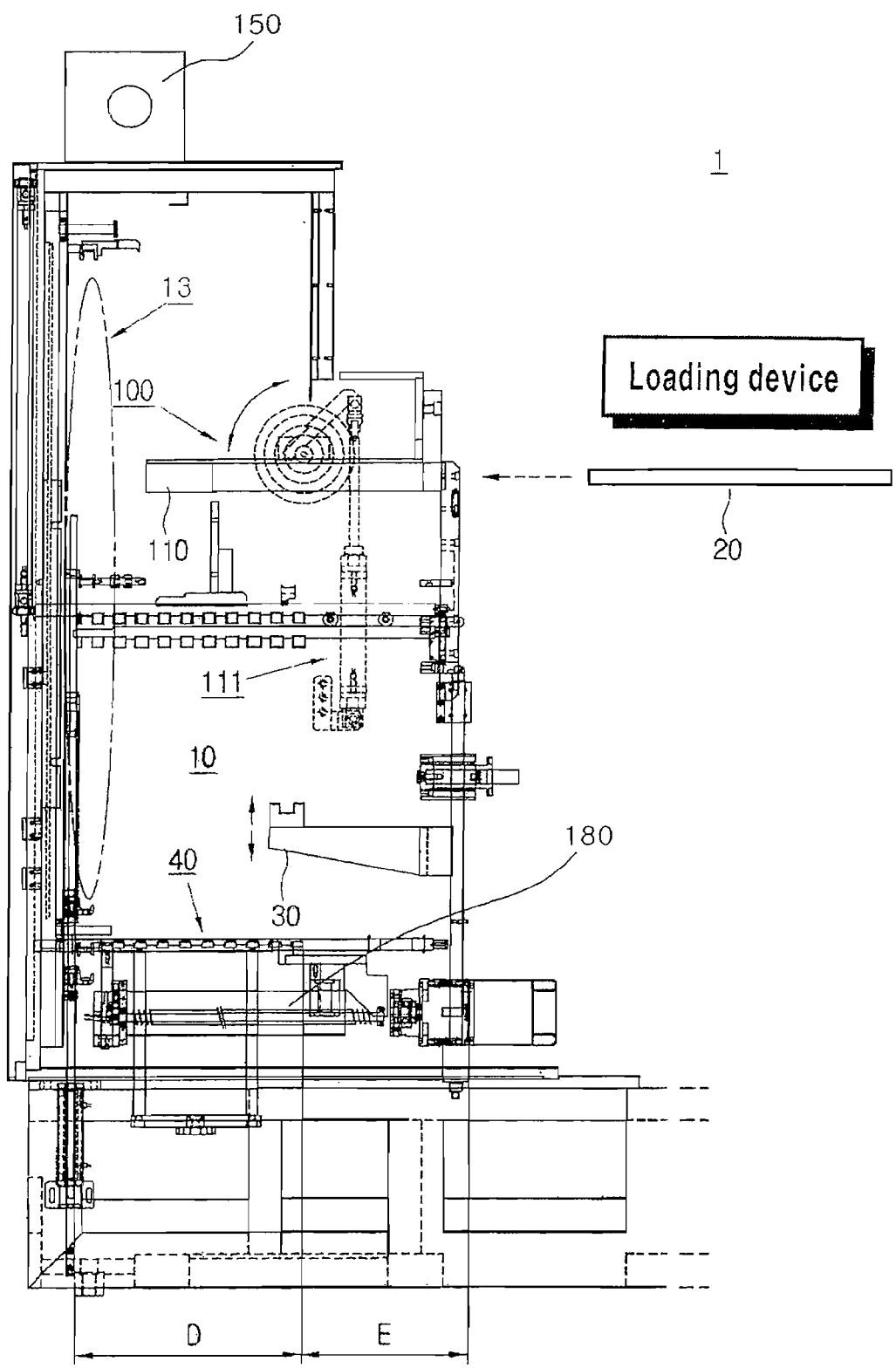
FIG. 1 is a schematic side view illustrating an inside structure of a soak chamber in a test handler according to an exemplary embodiment of the present invention.
Figure 2:
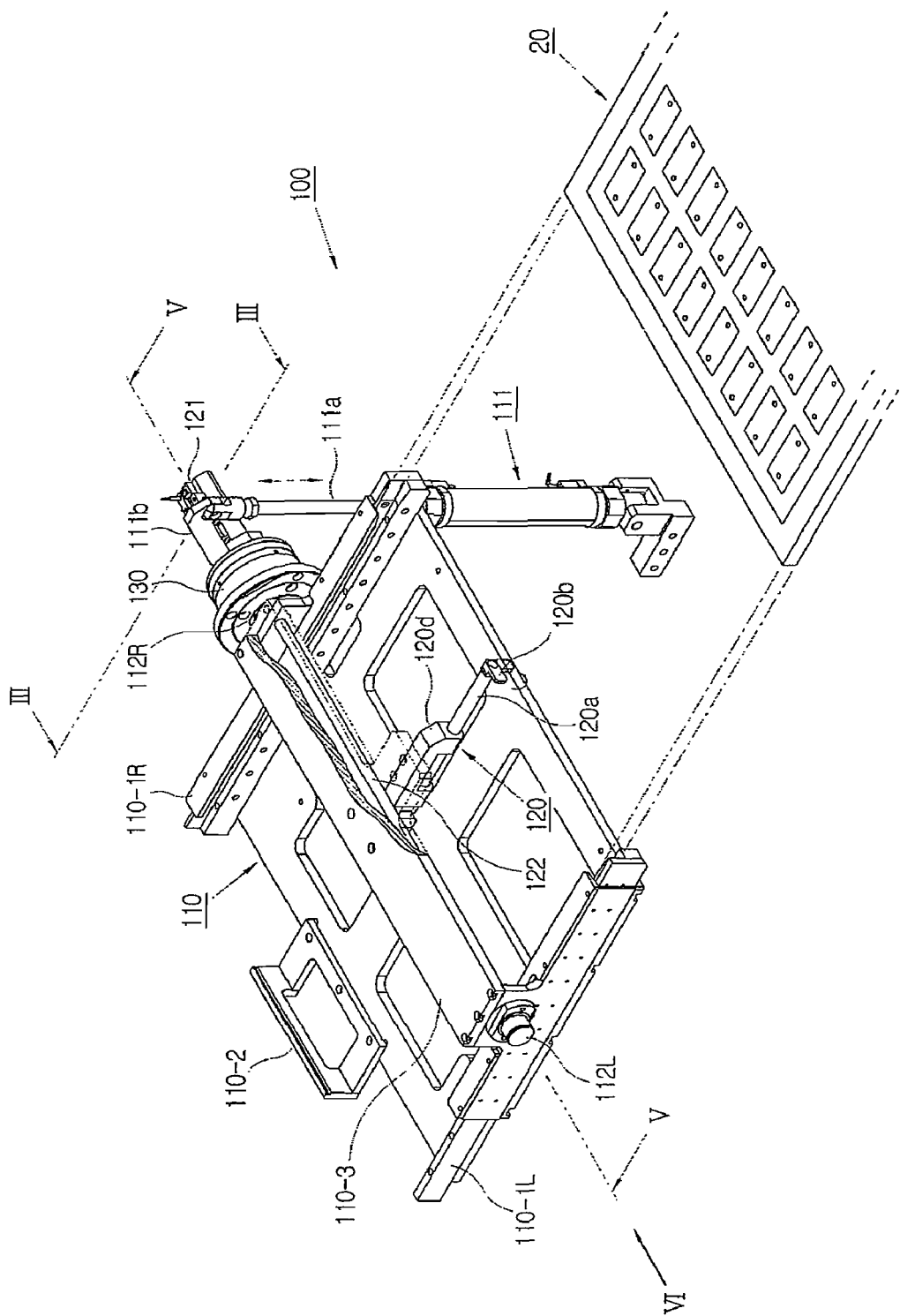
FIG. 2 is a perspective view illustrating a posture changing unit of the test handler of FIG. 1 according to an exemplary embodiment of the present invention.
Figure 3:
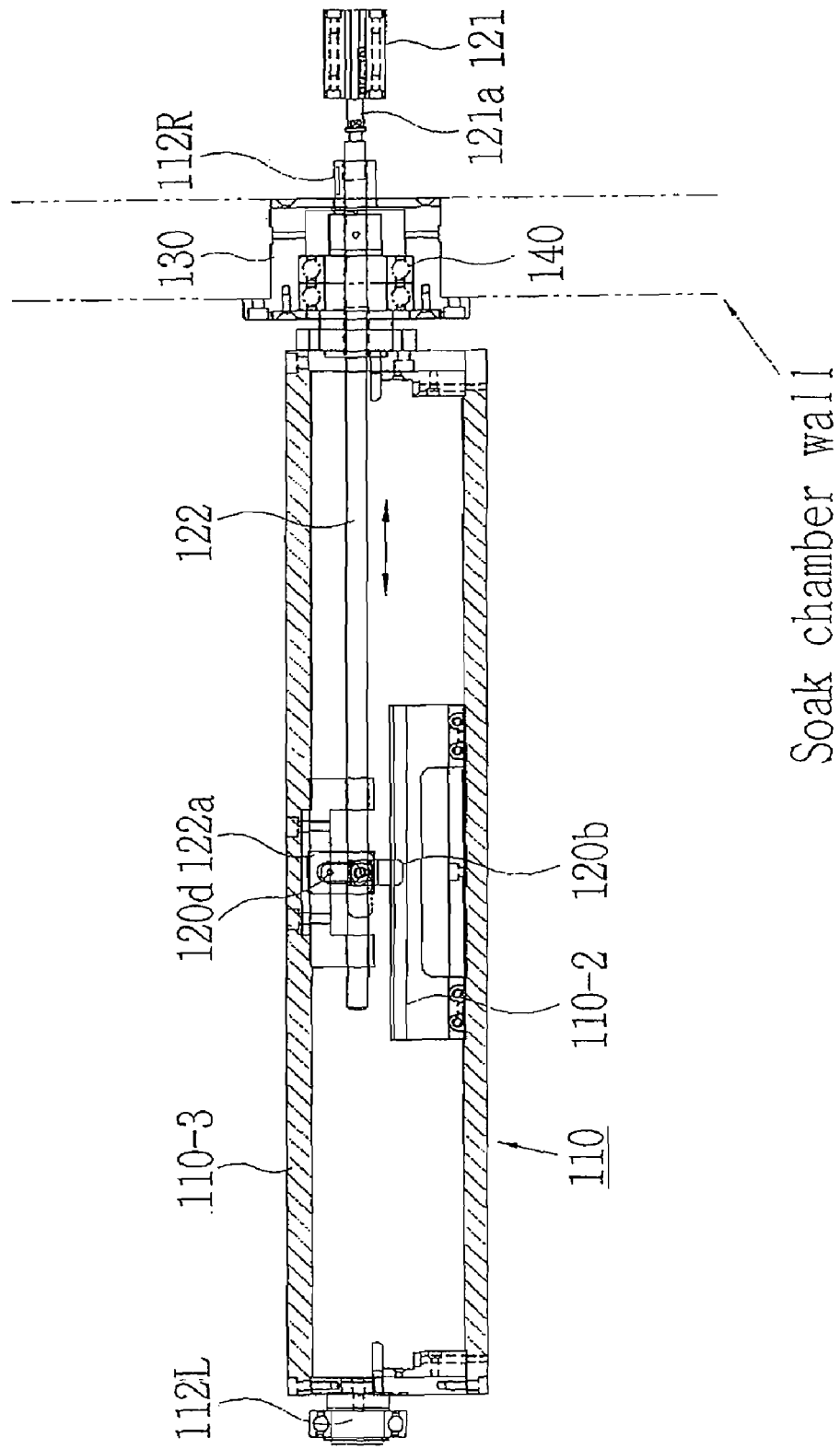
FIG. 3 is a cross-sectional view taken along line V-V of FIG. 2 according to an exemplary embodiment of the present invention.
Figure 4:
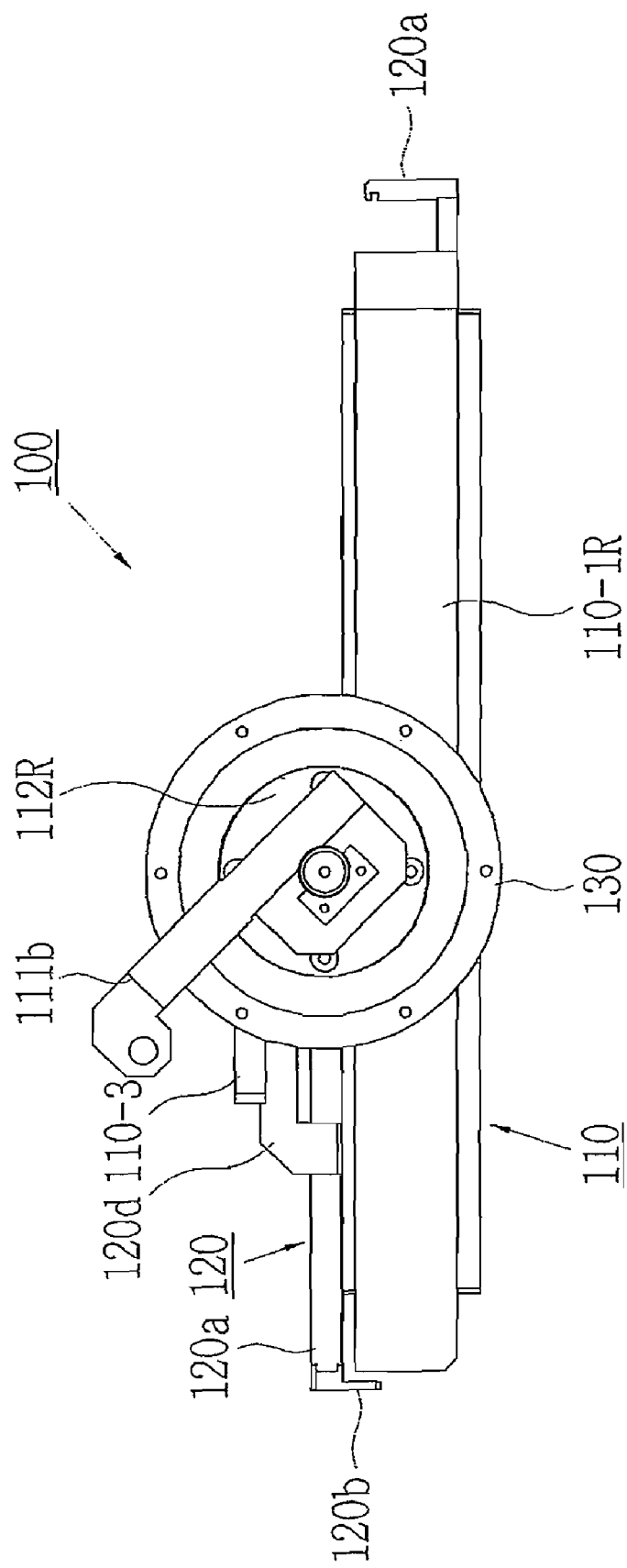
FIG. 4 is a side view seen from III-III direction of FIG. 2 according to an exemplary embodiment of the present invention.
Figure 5:
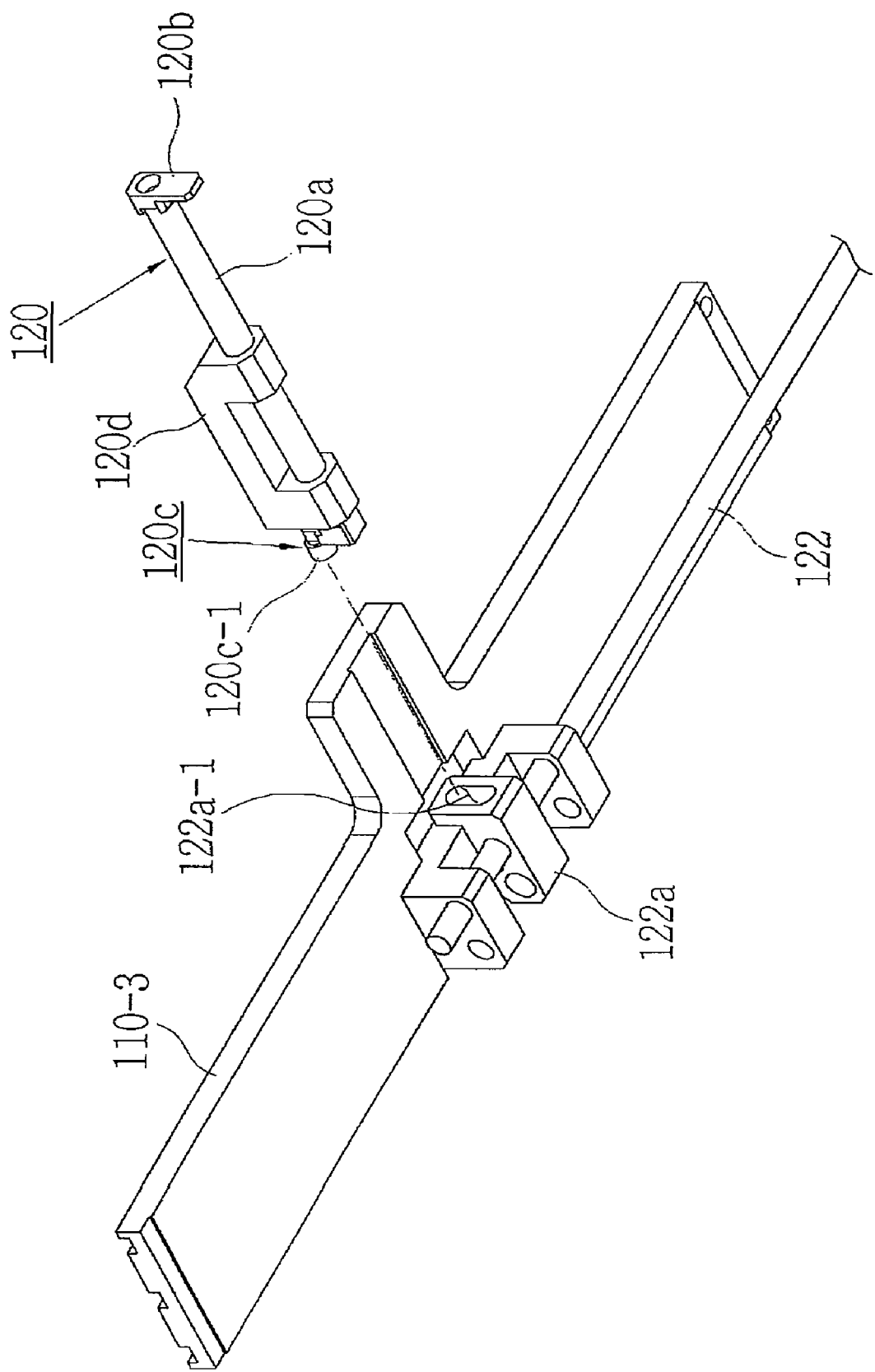
FIG. 5 is a schematic bottom view illustrating a stopper and a second power transmitting shaft arranged in the posture changing unit of FIG. 2 according to an exemplary embodiment of the present invention.

FIG. 1 is a schematic side view illustrating an inside structure of a soak chamber in the test handler according to an exemplary embodiment of the present invention. FIG. 2 is a perspective view illustrating a posture changing unit according to an exemplary embodiment of the present invention. FIG. 3 is a cross-sectional view taken along line V-V of FIG. 2. FIG. 4 is a side view seen from III-III direction of FIG. 2 according to an exemplary embodiment of the present invention. FIG. 5 is a schematic bottom view illustrating a stopper and a second power transmitting shaft arranged in the posture changing unit of FIG. 2 according to an exemplary embodiment of the present invention.

Referring to FIG. 1, the test handler 1 includes a soak chamber 10, a soak posture changing unit 100, a test chamber 13, a first temperature control unit 150 and a second temperature control unit 180. The soak posture changing unit 100 performs vertical posture change of a test tray 20 in the soak chamber 10. The soak chamber 10 and the test chamber 13 are linked to each other, for example, in an L shape on the plan view. A de-soak chamber (not shown) is disposed at the side of the test chamber 13 symmetrically to the soak chamber 10. A de-soak posture changing unit (not shown) is positioned on the de-soak chamber. For example, the de-soak posture changing unit can have the same structure as that of the soak posture changing unit 100. The soak chamber 10, the test chamber 13 and the de-soak chamber can be arranged, for example, in a U shape on the plan view.

In the soak chamber 10, the vertical posture change and translation of the test tray 20 are sequentially carried out with continuously pre-heating/pre-cooling the test tray 20. During the vertical posture change, the test tray 20 is pre-heated/pre-cooled mainly by the first temperature control unit 150 positioned at the upper portion of the test chamber 13, and during the translation, the test tray 20 is pre-heated/pre-cooled mainly by the second temperature control unit 180 positioned at the lower portion of the soak chamber 10. In addition, the first temperature control unit 150 selectively supplies hot or cold air to a test chamber region (standby unit in which the test tray 20 finishing the translation and the pre-heating/pre-cooling stands by to enter a test unit) at the rear portion of the soak chamber 10. At least any one of the first temperature control unit 150 and the second temperature control unit 180 can include a heater for emitting heat, a heater fan for diffusing the heat emitted from the heater to the test tray side, and a nozzle for injecting LN2 gas.

The soak posture changing unit (or vertical posture changing unit) 100 changes a horizontal posture of the test tray 20 into a vertical posture in the soak chamber 10. The soak posture changing unit 100 includes a rotator 110, a first power source, a first power transmitting shaft 112R, a stopper 120, a second power source, a second power transmitting shaft 122, a flange 130 and a bearing 140. On the other hand, the de-soak posture changing unit (not shown) changes a vertical posture of the test tray 20 into a horizontal posture inside or outside the de-soak chamber (not shown). The de-soak posture changing unit can have the same structure as that of the soak posture changing unit 100, which is not intended to be limiting. Hereinafter, the posture changing unit means the soak posture changing unit 100. Preferably, the de-soak posture changing unit performs horizontal posture change of the test tray 20 in the de-soak chamber. This structure enables the semiconductor devices to be heated or cooled during the horizontal posture change of the test tray 20, so that the semiconductor devices can be stably restored to the normal temperature. In this case, the inside temperature of the de-soak chamber relatively approximates to the normal temperature. Accordingly, even if the entire components of the de-soak posture changing unit are installed in the de-soak chamber, durability of the de-soak posture changing unit is not reduced. Differently from the de-soak posture changing unit, the soak posture changing unit 100 must be operated at a considerably high or low temperature. Therefore, the soak posture changing unit 100 needs a structure for preventing reduction of durability, which will be described later.

The rotator 110 is positioned at the upper portion of the inside space of the soak chamber 10. The rotator 110 is axially coupled to one side wall of the soak chamber 10 through a rotatable first power transmitting shaft 112R, and axially coupled to the other side wall of the soak chamber 10 through an idling shaft 112L. The rotator 110 is rotatable and holds the test tray 20 on which the test objects, namely, the devices have been loaded. A support stand 110-2 for supporting the test tray 20 entering along a pair of entering rails 110-1R and 110-1L is installed at the rear portion of the rotator 110. A top cover 110-3 for covering the rotator 110 to cross the rotator 110 and connecting the center portions of the pair of entering rails 110-1R and 110-1L is bolt-coupled to the upper region of the rotator 110.

The first power source is disposed outside the soak chamber 10 and comprised of a pneumatic cylinder 111 (referred to as a 'first power source' to be distinguished from a pneumatic cylinder which is a second power source discussed later). A piston rod 111a of the first power source 111 is coupled to the first power transmitting shaft 112R through a link 111b in the tangent direction. In this embodiment, when the piston rod 111a moves forward by the operation of the first power source 111, the rotator 110 maintains a horizontal posture, and when the piston rod 111a moves backward, the rotator 110 maintains a vertical posture. Here, the pneumatic cylinder is employed as the first power source 111. A forward/backward rotating motor or a solenoid unit can also be used as the first power source 111. The first power source 111 can be disposed in the soak chamber 10. In this case, the environment of the soak chamber 10 may affect the operation or life span of the first power source 111. Preferably, the first power source 111 is disposed outside the soak chamber 10. A cylinder or motor having excellent high and low temperature characteristics and durability can be efficiently used as the first power source 111 installed in the soak chamber 10. Such a cylinder or motor is expensive and will increase the cost of the test handler.

The first power transmitting shaft 112R is rotatably installed through the wall of the soak chamber 10, and formed in a hollow tube shape. The first power transmitting shaft 112R is rotated by power supplied from the first power source 111 through the link 111b, thereby transmitting a rotation force to the rotator 110.

As illustrated in FIGS. 2 to 5, the stopper 120 is disposed at the front top region of the rotator 110 to be rotatable by about 90°. The stopper 120 includes an extended unit 120a having its front end extended to be adjacent to the rear end of the test tray 20, a hooking unit 120b disposed at the front end of the extended unit 120a and rotated with the extended unit 120a, for directly hooking the rear end of the test tray 20 completely entering the rotator 110, and an eccentric protrusion unit 120c having an eccentric protrusion 120c-1 at the rear end of the extended unit 120a as shown in FIG. 5 in detail. The extended unit 120a of the stopper 120 is fixed to the center portion of the top cover 110-3 through a support bracket 120d to be rotatable in the forward or backward direction. When the extended unit 120a is rotated, the hooking unit 120b is rotated to hook or unhook the test tray 20 received in the rotator 110.

The eccentric protrusion 120c-1 is formed on the eccentric protrusion unit 120c slantly from the rotation center of the extended unit 120a. When the eccentric protrusion 120c-1 is pushed or pulled, the extended unit 120a is rotated. That is, a sliding block 122a having a long hole 122a-1 on the second power transmitting shaft 122 serves as a cam, and the eccentric protrusion unit 120c serves as a cam follower. This coupling structure will later be explained in detail.

The second power source is comprised of a pneumatic cylinder 121 (referred to as 'second power source' to be distinguished from the pneumatic cylinder which is the first power source), and disposed outside the soak chamber 10. In this embodiment, the second power source 121 is installed in the side direction of the first power transmitting shaft 112R outside the soak chamber 10.

Still referring to FIGS. 2 and 3, the second power transmitting shaft 122 passes through the inside the first power transmitting shaft 112R with the same axis center as that of the first power transmitting shaft 112R. The second power transmitting shaft 122 is slidably mounted along the top cover 110-3. In more detail, one side of the second power transmitting shaft 122 is extended to a piston rod side 121a of the second power source 121, and the other side thereof is extended to the inside of the soak chamber 10. In addition, the second power transmitting shaft 122 has its one end coaxially arranged with and coupled to the piston rod 121a of the second power source 121 (if necessary, the second power transmitting shaft 122 can be incorporated with the piston rod 121a). The other end of the second power transmitting shaft 122 extended to the inside of the soak chamber 10 is fixedly coupled to the sliding block 122a having the long hole 122a-1 for sufficiently receiving the eccentric protrusion 120c-1 of the eccentric protrusion unit 120c of the stopper 120. Accordingly, when the piston rod 121a moves forward or backward by the operation of the second power source 121, the second power transmitting shaft 122 and the sliding block 122a move forward or backward to push or pull the eccentric protrusion 120c-1, thereby rotating the stopper 120. As a result, the test tray 20 held by the rotator 110 is hooked or unhooked by the hooking unit 120b.

The flange 130 is fixedly coupled through the wall of the soak chamber 10 and formed in a hollow tube shape. The first power transmitting shaft 112R passes through the flange 130. Since the second power transmitting shaft 122 passes through the first power transmitting shaft 112R, the first power transmitting shaft 112R and the second power transmitting shaft 122 pass through the flange 130.

The bearing 140 is positioned between the flange 130 and the first power transmitting shaft 112R, for softly rotating the first power transmitting shaft 112R.

The operation of the posture changing unit 100 will now be described with reference to FIGS. 6 to 10.

FIGS. 6 to 10 are operational state views illustrating the posture changing process of the posture changing unit 100, seen from VI direction of FIG. 2 according to an exemplary embodiment of the present invention.

Figure 6:
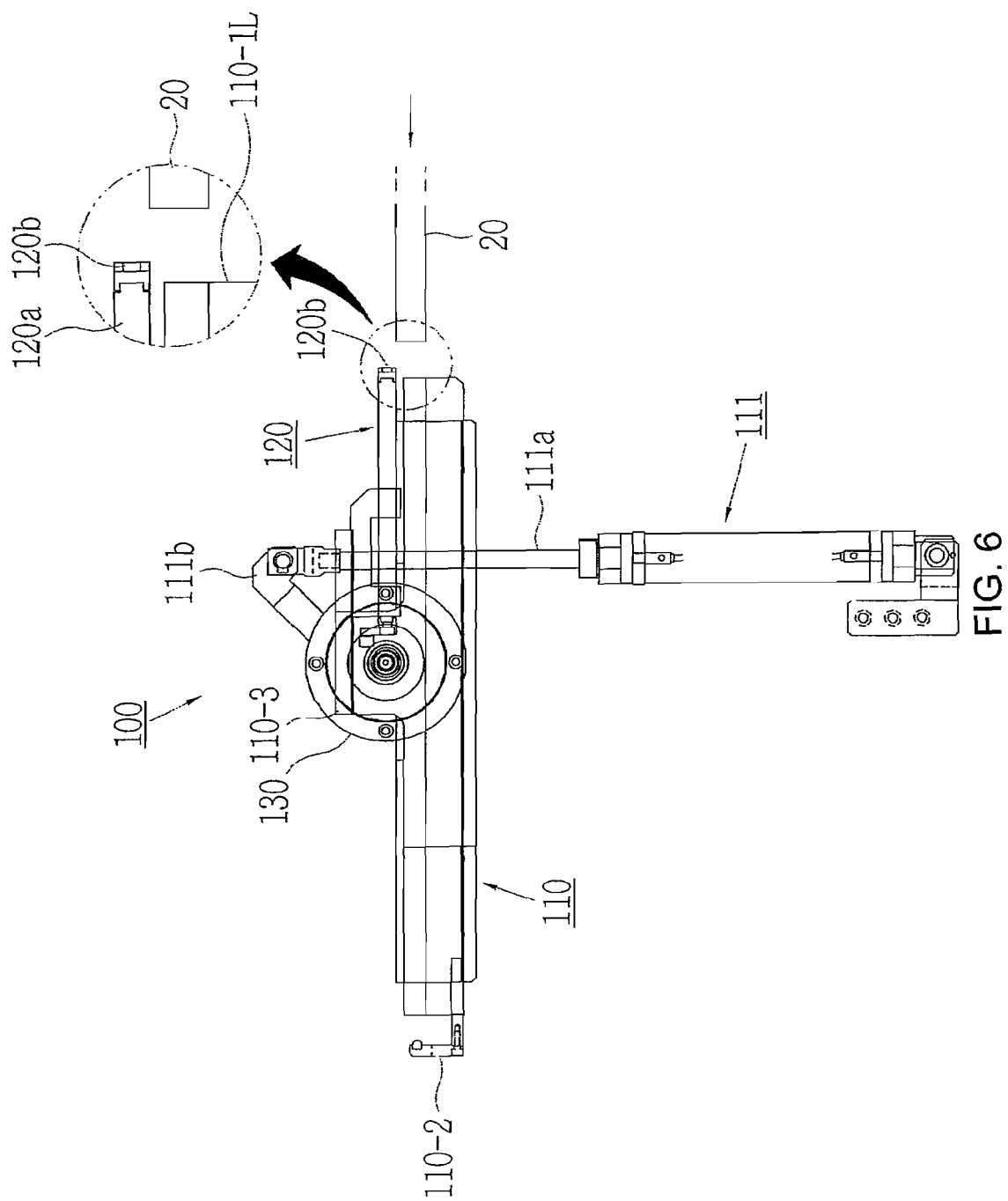
FIG. 6 is a schematic diagram illustrating a horizontal posture of the posture changing unit seen from VI direction of FIG. 2, especially, an entering allowable state of a test tray according to an exemplary embodiment of the present invention.
Figure 7:
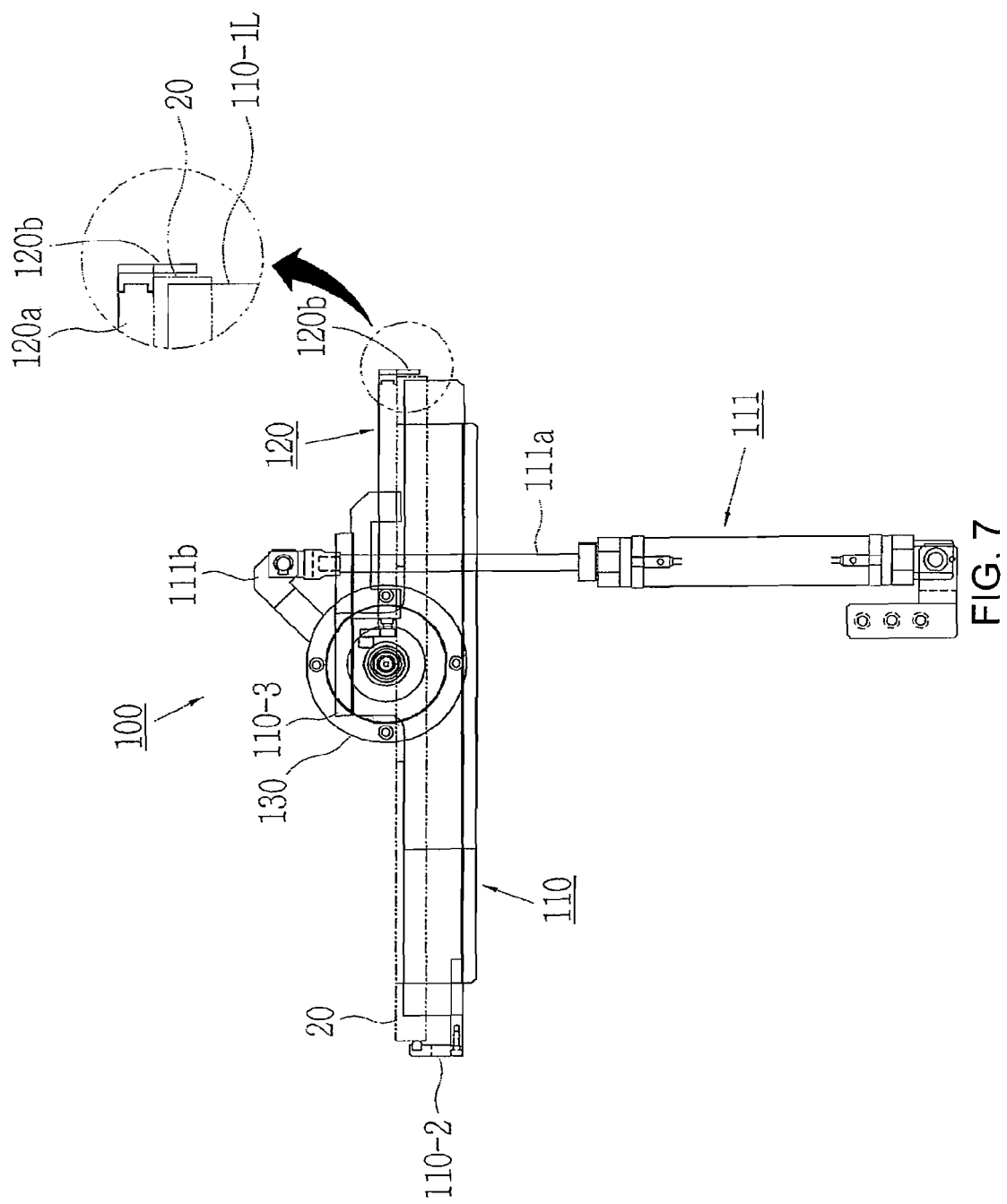
FIG. 7 is a schematic diagram illustrating a separation preventing state of the entered test tray in the posture changing unit of FIG. 2 according to an exemplary embodiment of the present invention.

At the initial stage, the rotator 110 of the posture changing unit 100 maintains a horizontal posture in the upper space of the soak chamber 10 (the piston rod 111a moves forward), and the stopper 120 is rotated in the unhooking direction, thereby generating the state of FIG. 6 allowing entrance of the test tray 20. Here, the test tray 20 on which the devices have been loaded by the loading unit enters the soak chamber 10 through a horizontal transferring unit (not shown).

That is, the test tray 20 horizontally enters the rotator 110 along the pair of entering rails 110-1R and 110-1L until the test tray 20 contacts the support stand 110-2.

After the test tray 20 enters the rotator 110, the second power source 121 is engaged, the second power transmitting shaft 122 slides into the soak chamber 10, and the sliding block 122a also slides to push the eccentric protrusion 120c-1. Therefore, the stopper 120 is rotated in the hooking direction by about 90°, thereby generating the state of FIG. 7 preventing separation of the test tray 20. That is, the stopper 120 is hooked on the end of the test tray 20, so that the test tray 20 can be stably positioned in the rotator 110.

Figure 8:
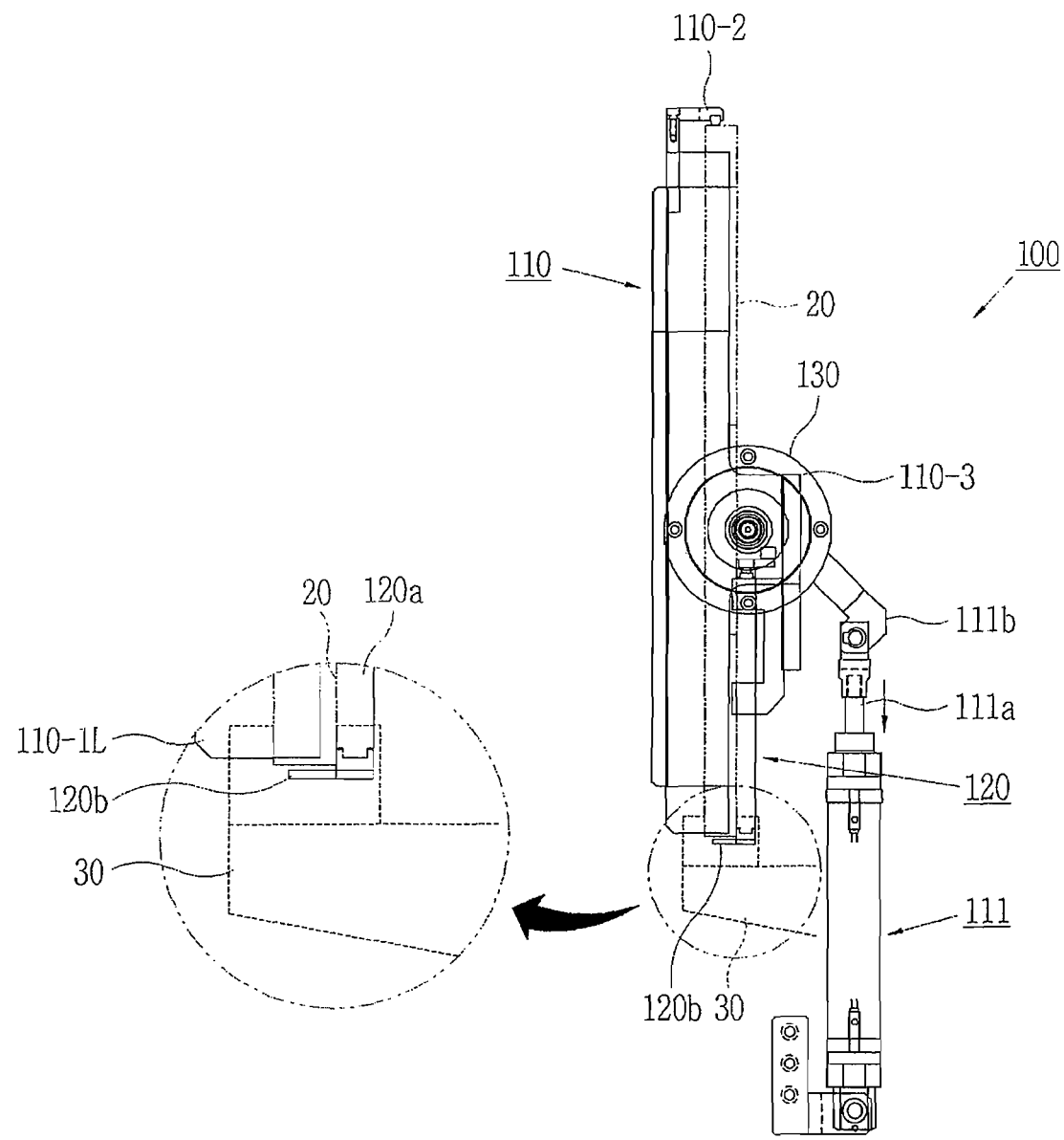
FIG. 8 is a schematic diagram illustrating a vertical posture of the posture changing unit of FIG. 2 according to an exemplary embodiment of the present invention.

In the above state, when the first power source 111 is operated and the piston rod 111a moves backward, as shown in FIG. 8, the rotator 110 is rotated by 90° around the idling shaft 112L and the first power transmitting shaft 112R, and the horizontal posture of the test tray 20 is changed into a vertical posture. The bottom end of the vertical posture test tray 20 is supported by a vertical move rail 30. Because the second power transmitting shaft 122 is installed to pass through the first power transmitting shaft 112R, even if the rotator 110 is rotated, if there is no artificial force, the state of the second power transmitting shaft 122 is maintained as it is.

Figure 9:
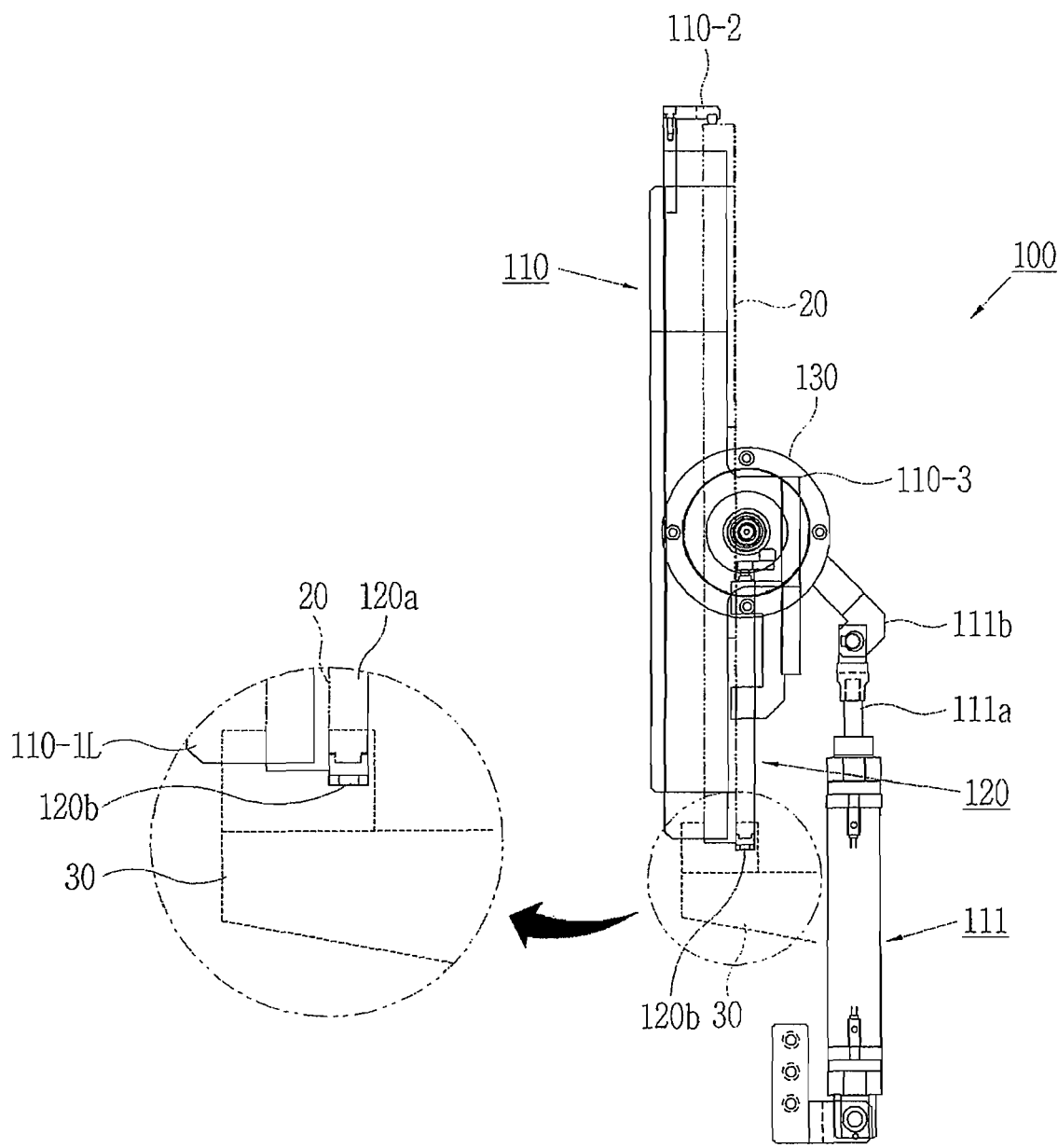
FIG. 9 is a schematic diagram illustrating a lowering allowable state of the test tray in the posture changing unit of FIG. 2 according to an exemplary embodiment of the present invention.

As depicted in FIG. 9, when the test tray 20 supported by the vertical move rail 30 is sensed by a sensor (not shown), the second power source 121 is engaged again, and the piston rod 121a moves backward. Therefore, the second power transmitting shaft 122 moves backward, and the stopper 120 is rotated in the unhooking direction by about 90°, thereby preparing an exit environment of the test tray 20. In the above process, the test tray 20 is pre-heated/pre-cooled mainly by the first temperature control unit 150.

Figure 10:
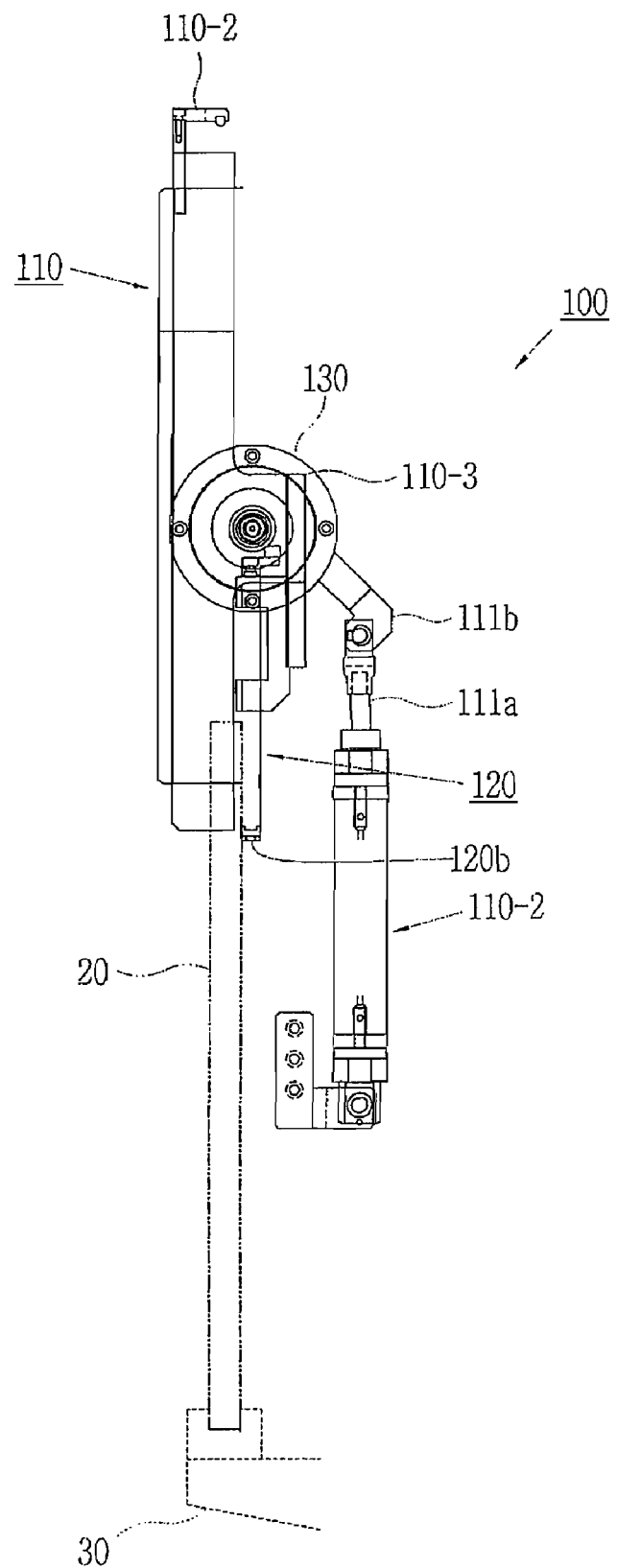
FIG. 10 is a schematic diagram illustrating a lowering process of the test tray in the posture changing unit of FIG. 2 according to an exemplary embodiment of the present invention.

As illustrated in FIG. 10, during the vertical move rail 30 is lowered, the test tray 20 is also lowered by a self weight. Thereafter, the test tray 20 is translated to the lower portion of the soak chamber 10 by a translating unit 40 (refer to FIG. 1), and sufficiently pre-heated/pre-cooled mainly by the second temperature control unit 180.

On the other hand, when it is confirmed that the test tray 20 has completely exited from the rotator 110, the first power source 111 is engaged again, and the piston rod 111a moves forward. As shown in FIG. 6, the posture of the rotator 110 is changed into a horizontal posture. Accordingly, a new test tray 20 on which devices have been loaded can enter the rotator 110.

By repeating the above process, the test trays 20 on which the devices have been loaded are carried into the lower space of the soak chamber 10. While the test trays 20 are translated closely to a test chamber (not shown) by the translating unit 40 to be sequentially received, the pre-heating/pre-cooling is performed thereon. As a result, before entering the test chamber, the test trays 20 are sufficiently pre-heated/pre-cooled.

That is, as described above, the pre-heating/pre-cooling can be performed during the process of changing the posture of the test tray 20 or the process of moving the posture-changed test tray 20 to the downward direction, thereby reducing a translation distance D (refer to FIG. 1) of translating the test tray 20 on which the test objects, namely, the devices have been loaded to the test chamber side (left side of FIG. 1), and obtaining the sufficient pre-heating/pre-cooling time of the devices. A margin space obtained by a margin length E (refer to FIG. 1) due to a reduction in the translation distance D can be used as an installation space for other devices. Even if the test tray 20 is enlarged, the whole size of the test handler is not seriously changed.

Figure 11:
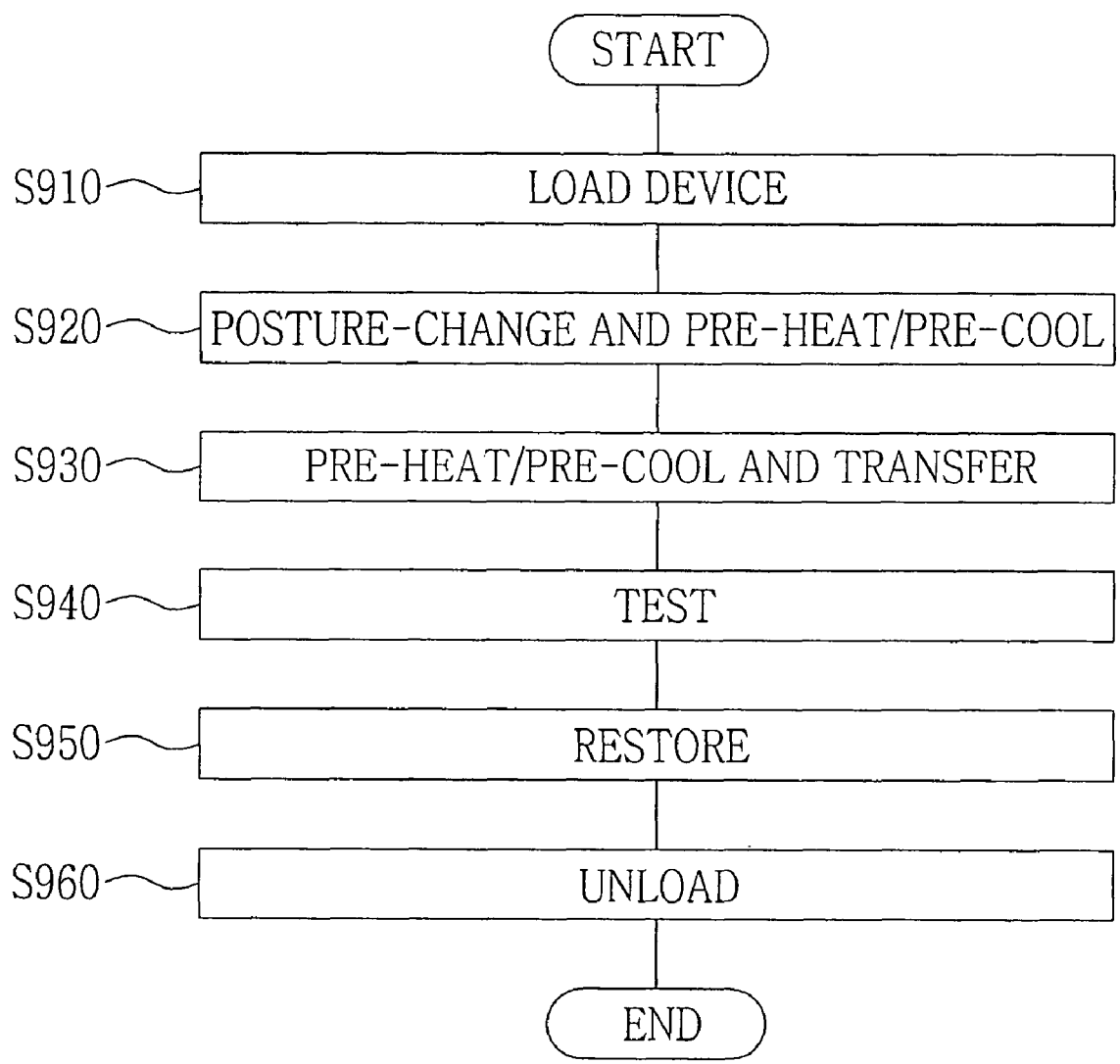
FIG. 11 is a flowchart illustrating an operation method of a test handler according to an exemplary embodiment the present invention.
Figure 12:
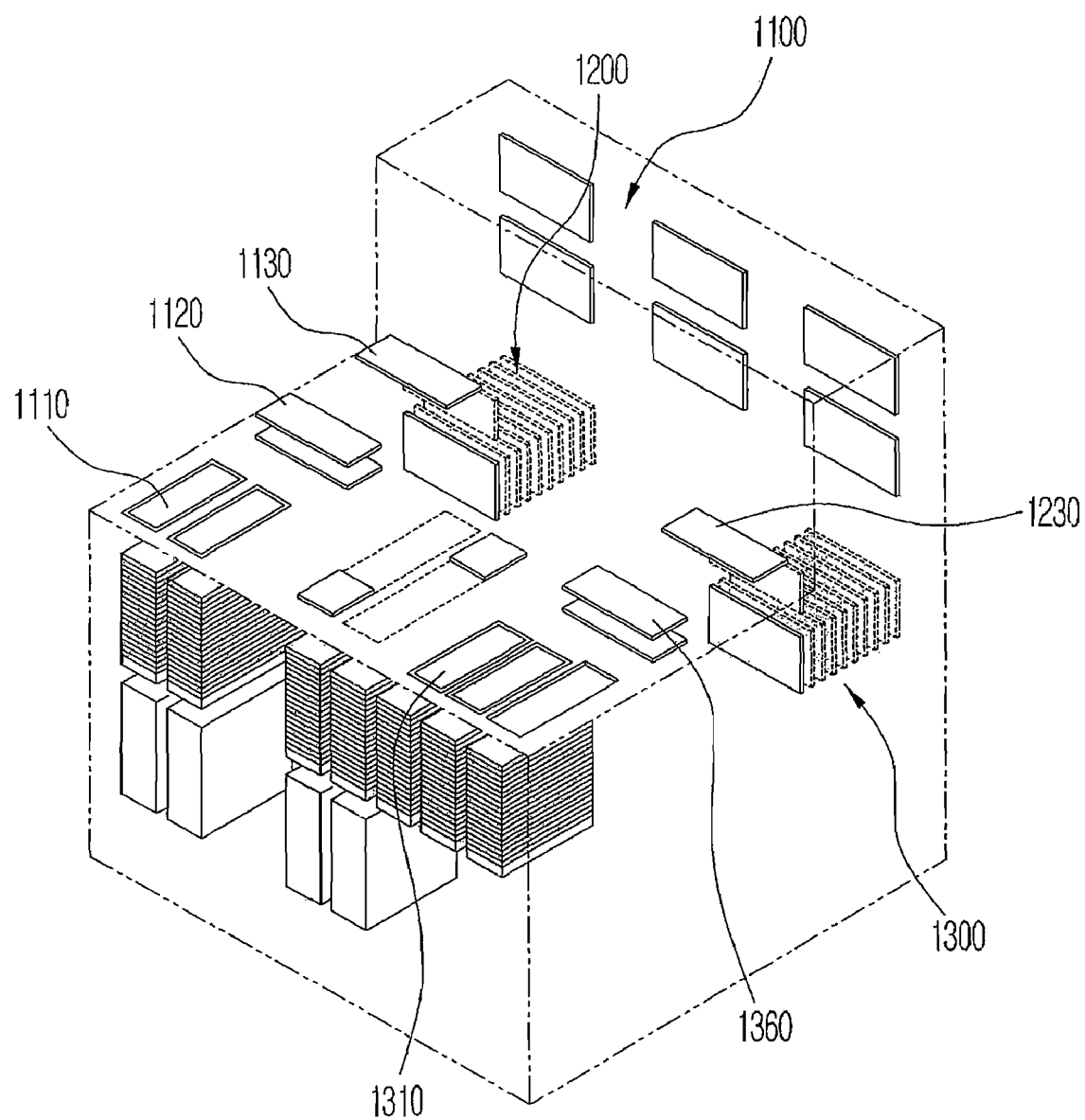
FIG. 12 is a schematic structure view illustrating a conventional side docking type test handler according to an exemplary embodiment of the present invention.

An operation method of the test handler according to an exemplary embodiment of the present invention will now be summarized with reference to FIG. 11.

1. Device Loading (S910)

The devices of the user trays are loaded onto the horizontal posture test tray.

2. Posture Change and Pre-Heating/Pre-Cooling (S920)

After the devices are loaded, the horizontal posture of the test tray is changed into the vertical posture while being pre-heated/pre-cooled.

3. Pre-Heating/Pre-Cooling and Translation (S930)

The vertical posture test tray is translated closely to the test chamber in the vertical posture while being pre-heated/pre-cooled.

4. Test (S940)

The devices loaded on the test tray transferred to the test chamber having the test environment where the devices are tested.

5. Restoration, Translation and Posture Change (S950)

After the test, the test tray is translated far from the test chamber in the vertical posture with the hot or cold devices being restored to the normal temperature, and the vertical posture of the test tray is changed to the horizontal posture.

6. Unloading (S950)

The devices loaded on the horizontal posture test tray are sorted and unloaded to the user trays according to the test results.

According to the foregoing method, the pre-heating/pre-cooling is performed during the vertical posture change of the test tray, thereby reducing the pre-heating/pre-cooling time and the overall test time.

As described above, certain exemplary embodiments of the present invention provides the following advantages.

First, the test tray on which the test objects, namely, the devices have been loaded is held and posture-changed by the posture changing unit disposed in the soak chamber, in more detail, the rotator disposed in the soak chamber. While the test tray is posture-changed or until the test tray is stably positioned in the translating unit after the posture change, the devices are continuously pre-heated/pre-cooled. Therefore, the overall test time of the devices can be reduced.

Second, the test tray can be enlarged without increasing the whole size of the test handler, by changing the horizontal posture of the test tray into the vertical posture in the soak chamber, and decreasing the translation distance.

Third, the rotator or the stopper is installed inside the soak chamber, and the power sources for operating the rotator or the stopper are installed outside the soak chamber, so that each power source cannot be affected by the inside environment of the soak chamber. As a result, the test tray is posture-changed in the soak chamber without deteriorating the life span or operational state of the power sources by the environment of the soak chamber.

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

While the invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A posture changing apparatus for a test handler comprising:
    a rotator for holding a test tray;
    a first power source for providing power to rotate the rotator;
    a first power transmitting shaft, shaped as a tube, for transmitting power from the first power source to the rotator;
    a stopper for hooking or unhooking the test tray, held by the rotator, to selectively prevent separation of the test tray;
    a second power source for providing power required to operate the stopper; and
    a second power transmitting shaft, extended through the first power transmitting shaft, for transmitting power from the second power source to the stopper;
    wherein the test handler comprises the rotator.

2. The posture changing apparatus according to claim 1, wherein the first and second power sources have the same axis.

3. The posture changing apparatus according to claim 1, wherein:
    the first power transmitting shaft is rotated by power from the first power source and transmits its rotational force to the rotator; and
    the second power transmitting shaft moves back and forth, is powered by the second power source, and transmits its operational force to the stopper.

4. The posture changing apparatus according to claim 1, wherein at least one of the first and second power sources is a pneumatic cylinder.

5. The posture changing apparatus according to claim 1, wherein:
    the first power transmitting shaft is pivotally coupled to a wall of a sock soak chamber of the test handler;
    the rotator and the stopper are located inside the soak chamber; and
    the first and second power sources are located outside the soak chamber.

6. A power transmitting apparatus for a test handler comprising:
    at least two power transmitting shafts for transmitting power from at least two or more power sources to at least two or more operated objects;
    wherein the at least two power transmitting shafts comprise:
        a first power transmitting shaft, shaped as a tube, for transmitting power from a first power source, one of the at least two power sources, to a first operated object, one of the at least two operated objects; and
        a second power transmitting shaft, extended through the first power transmitting shaft, for transmitting power from a second power source, the other of the at least two power sources, to a second operated object, the other of the at least two operated objects,
    wherein the at least two operated objects comprise a rotator and a stopper; and
    wherein the test handler comprises the rotator.

7. The power transmitting apparatus according to claim 6, wherein the at least two or more power transmitting shafts have the same axis.

8. The power transmitting apparatus according to claim 6, wherein:
    the first power transmitting shaft is coupled to the at least two power sources and the at least two operated objects and transmits power to the at least two operated objects; and
    the second power transmitting shaft is configured to extend through the first power transmitting shaft.

9. A power transmitting apparatus for a test handler comprising:
- a flange that is shaped as a tube and coupled to two power sources and two operated objects; and
- first and second power transmitting shafts, extended through the flange, for transmitting power from the power sources to the operated objects;
- wherein the two operated objects comprise a rotator and a stopper; and
- wherein the test handler comprises the rotator.

10. The power transmitting apparatus according to claim 9, wherein:
- the first power transmitting shaft is shaped as a tube; and
- the second power transmitting shaft is configured to extend through the first power transmitting shaft.

* * * * *